United States Patent
Yoneya et al.

(10) Patent No.: US 7,327,328 B2
(45) Date of Patent: Feb. 5, 2008

(54) ANTENNA UNIT HAVING A SHIELD COVER WITH NO GAP BETWEEN FOUR SIDE WALL PORTIONS AND FOUR CORNER PORTIONS

(75) Inventors: Akira Yoneya, Akita (JP); Kazunari Saito, Akita (JP); Yoshiaki Imano, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 35 days.

(21) Appl. No.: 11/448,632

(22) Filed: Jun. 7, 2006

(65) Prior Publication Data

US 2006/0279468 A1    Dec. 14, 2006

(30) Foreign Application Priority Data

Jun. 8, 2005    (JP)    ............... 2005-167992

(51) Int. Cl.
*H01Q 1/52*    (2006.01)
(52) U.S. Cl. .................... 343/841; 455/575.5
(58) Field of Classification Search ......... 343/700 MS, 343/702, 841; 455/575.5
See application file for complete search history.

(56) References Cited

U.S. PATENT DOCUMENTS

| | | | |
|---|---|---|---|
| 5,585,806 A * | 12/1996 | Ogino et al. ......... | 343/700 MS |
| 6,204,825 B1 * | 3/2001 | Wilz .................... | 343/841 |
| 6,850,196 B2 * | 2/2005 | Wong et al. ......... | 343/702 |
| 6,946,996 B2 * | 9/2005 | Koyama ............... | 343/700 MS |
| 6,975,272 B2 * | 12/2005 | Yuanzhu .............. | 343/700 MS |
| 7,151,503 B2 * | 12/2006 | Noro et al. .......... | 343/872 |
| 2003/0103014 A1 * | 6/2003 | Birnbaum et al. ... | 343/841 |
| 2004/0135733 A1 * | 7/2004 | Chou et al. ......... | 343/841 |
| 2004/0257281 A1 * | 12/2004 | Noro et al. ......... | 343/700 MS |
| 2005/0068247 A1 | 3/2005 | Yoneya et al. | |
| 2005/0122268 A1 * | 6/2005 | Suzuki ................ | 343/702 |
| 2006/0071856 A1 * | 4/2006 | Shinkai et al. ...... | 343/700 MS |
| 2006/0273968 A1 * | 12/2006 | Noro .................... | 343/713 |

FOREIGN PATENT DOCUMENTS

JP    8-293688    11/1996

* cited by examiner

*Primary Examiner*—Tan Ho
(74) *Attorney, Agent, or Firm*—Frishauf, Holtz, Goodman & Chick, P.C.

(57) ABSTRACT

Mounted on a back surface (21*b*) of a circuit board (21), a shield cover (24) has a substantially rectangular ceiling portion (241) with four corners which are chamfered, four side wall portions (242-245), and four corner portions (457). The shield cover (24) is mounted on the back surface (21*b*) of the circuit board by soldering at the four corner portions (247). There is no gap between the four side wall portions (242-245) and the four corner portions (247). The shield cover (24) is formed by bending working of a metal plate (40) and has extension portions (248) at both ends of the four corner portions (247) so as to interpose with the side wall portions (242-245).

13 Claims, 6 Drawing Sheets

ANTENNA UNIT HAVING A SHIELD COVER WITH NO GAP BETWEEN FOUR SIDE WALL PORTIONS AND FOUR CORNER PORTIONS

This application claims priority to prior Japanese patent application JP 2005-167992, the disclosure of which is incorporated herein by reference.

BACKGROUND OF THE INVENTION

This invention relates to an antenna unit and, in particular, to structure of a shield cover of the antenna unit used as a Global Positioning System (GPS) antenna.

In the manner which is known in the art, in recent years, various antennas are mounted on a vehicle such as an automobile. For instance, there is a GPS antenna as one of the antennas.

The GPS (Global Positioning System) is a satellite positioning system using artificial satellites which are called GPS satellites. The GPS is a system which receives radio waves (GPS signals) transmitted from four GPS satellites among twenty-four GPS satellites orbiting the Earth, measures, on the basis of the received radio waves, position relationships and time errors between a mobile object and the four GPS satellites, and can calculate, on the basis of the principle of triangulation techniques, a position and/or an elevation of the mobile object on a map with high precision In recent years, the GPS have been used to a car navigation system for detecting a position of a running automobile or the like and becomes widespread. In the car navigation system, a car navigation apparatus comprises a GPS antenna for receiving the GPS signals, a processing unit for processing the GPS signals received by the GPS antenna to detect a current position of the vehicle, a display unit for displaying, on a map, the position detected by the processing unit, and so on.

On mounting the car navigation apparatus in the automobile, the GPS antenna for receiving the GPS signals is mounted outside of the automobile, for example, on a roof of the automobile or the like (see, for example, United States Patent Application Publication No. 2005/0068247 A1 which will later be called a patent document 1 hereinafter).

An antenna unit such as the GPS antenna comprises an antenna case and an antenna module accommodated in the antenna case. The antenna module comprises a circuit board having a main surface and a back surface, a planer antenna element such as a patch antenna mounted on the main surface of the circuit board, a low noise amplifier (LNA) circuit mounted on the back surface of the circuit board, a shield cover for shielding the LNA circuit.

The shield cover has, as a shape of a plan view, a substantially rectangular shape with four corners each of which is chamfered. That is, the shield cover has four corner portions at the four corners. In addition, the shield cover is mounted on the back surface of the circuit board by soldering the four corners (the four corner portions) by means of solder.

In the manner which will later be described in conjunction with FIGS. 1A, 1B, and 2, a conventional shield case comprises a ceiling portion, four side wall portions, and four corner portions. However, in the conventional shield cover, there are gaps at folded portions of the shield cover (i.e. between the four side wall portions and the four corner portions). As a result, on mounting the shield cover on the back surface of the circuit board by soldering, solder is flowed in the inside of the shield cover through the gaps and it results in danger of causing a short in the LNA circuit mounted in the inside of the shield cover.

In addition, a shield case for shielding a circuit board housed therein is known (see, for example, Japanese Unexamined Patent Publication No. Hei 8-293688 or JP-H 8-293688 A which will later be called a patent document 2 hereinafter). The shield case disclosed in the patent document 2 is for shielding the circuit board housed therein and is different in structure from the shield cover mounted on a back surface (one surface) of a circuit board in order to shield a circuit such as an LNA circuit mounted on the back surface (the one surface) of the circuit board.

SUMMARY OF THE INVENTION

It is therefore an object of the present invention to provide an antenna unit and a shield cover for use therein which are capable of preventing a signal processing circuit such as an LNA circuit mounted in the inside thereof from causing a short on soldering.

Other objects of this invention will become clear as the description proceeds.

According to a first aspect of this invention, an antenna unit comprises a circuit board having a main surface and a back surface which are opposed to each other, a planer antenna element mounted on the main surface of the circuit board, a signal processing circuit mounted on the back surface of the circuit board and connected to the planer antenna element, and a shield cover, mounted on the back surface of the circuit board, for shielding the signal processing circuit. The shield cover comprises a substantially rectangular ceiling portion with four corners which are chamfered, four side wall portions for extending in a predetermined direction at four sides of the ceiling portion, and four corner portions for extending in the predetermined direction at the four corners of the ceiling portion between the side wall portions which are adjacent to each other. The shield cover is mounted on the back surface of the circuit board by soldering at the four corner portions. No gap is provided between the four side wall portions and the four corner portions.

In the antenna unit according to the first aspect of this invention, the shield cover may be formed by bending working of a metal plate. In this event, the shield cover may comprise extension portions overlapping with the side wall portions at both ends of the four corner portions. The metal plate may have a shape which is bilaterally symmetrical about a central line extending back-and-forth. The antenna unit further may comprise a signal line connected to the signal processing circuit. The four side wall portions may comprise a front side wall portion, a rear side wall portion, a right side wall portion, and a left side wall portion. The front side wall portion may consist of a pair of front side pieces which are apart from each so that the central line forms the boundary therebetween and between which an opening is left. In this event, the shield cover may further comprise a holding piece, between the pair of front side wall pieces, for holding the signal line.

In the antenna unit according to the first aspect of this invention, the shield cover may be formed by drawing working of a metal plate using a press machine. In this event, the shield cover may have a shape where the side wall portion and the corner portion which are adjacent to each other are continuously associated.

In the antenna unit according to the first aspect of this invention, the antenna unit may comprise a Global Positioning System (GPS) antenna for receiving GPS signals transmitted from GPS satellites. The planer antenna element may comprise a patch antenna. The signal processing circuit may comprise a low noise amplifier (LNA) circuit for amplifying a signal received by the planer antenna element.

According to a second aspect of this invention, a shield cover is for shielding a circuit mounted on one surface of a circuit board. The shield cover comprises a substantially rectangular ceiling portion with four corners which are chamfered, four side wall portions for extending in a predetermined direction at four sides of the ceiling portion, and four corner portions for extending in the predetermined direction at the four corners of the ceiling portion between the side wall portions which are adjacent to each other. The shield cover is mounted on the one surface of the circuit board by soldering at the four corner portions. No gap is provided between the four side wall portions and the four corner portions.

In the shield cover according to the second aspect of this invention, the shield cover may be formed by bending working of a metal plate. In this event, the shield cover may comprise extension portions overlapping with the side wall portions at both ends of the four corner portions. The metal plate may have a shape which is bilaterally symmetrical about a central line extending back-and-forth. The four side wall portions may comprise a front side wall portion, a rear side wall portion, a right side wall portion, and a left side wall portion. The front side wall portion may consist of a pair of front side pieces which are apart from each so that the central line forms the boundary therebetween and between which an opening is left. The shield cover further may comprise a holding piece, between the pair of front side wall pieces, for holding a signal line connected to the circuit.

In the shield cover according to the second aspect of this invention, the shield cover may be formed by drawing working of a metal plate using a press machine. The shield cover may have a shape where the side wall portion and the corner portion which are adjacent to each other are continuously associated.

DESCRIPTION OF THE PREFERRED EMBODIMENTS

Figure 1A:
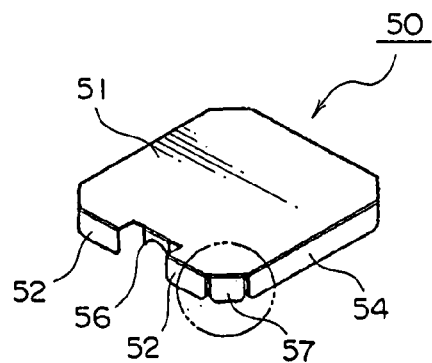
FIG. 1A is an external perspective view showing an overall appearance of a conventional shield cover.
Figure 1B:
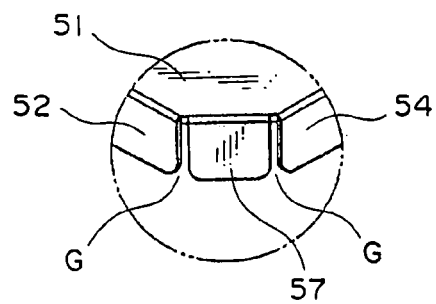
FIG. 1B is a fragmentary enlarged view of a portion enclosed by a circle of a two-dot-dash-line of FIG. 1A.
Figure 2:
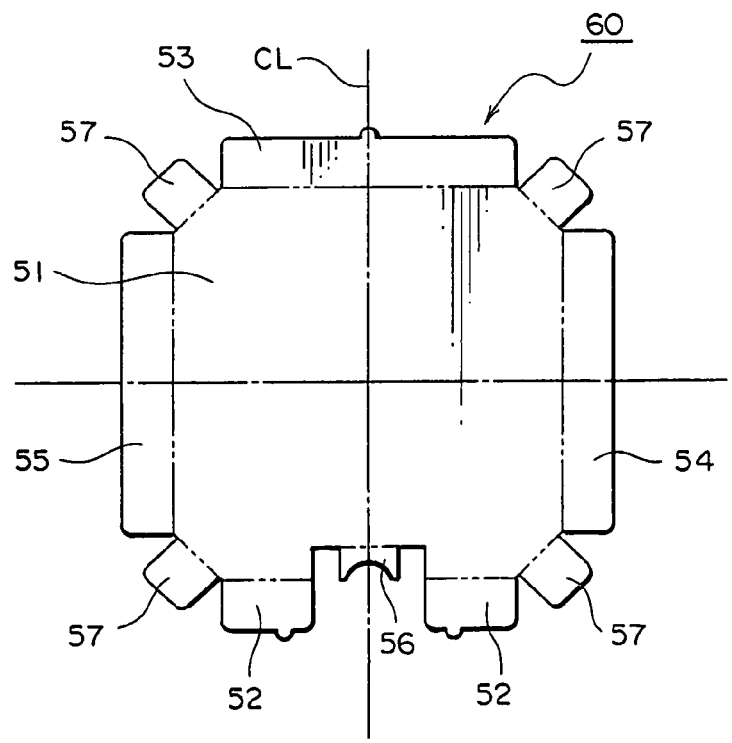
FIG. 2 is a plan view of a metal plate for forming the conventional shield cover illustrated in FIG. 1A.

Referring to FIGS. 1A, 1B, and 2, a conventional shield cover 50 will be described at first in order to facilitate an understanding of the present invention. FIG. 1A is an external perspective view showing an overall appearance of the conventional shield cover 50. FIG. 1B is a fragmentary enlarged view of a portion enclosed by a circle of a two-dot-dash-line of FIG. 1A. FIG. 2 is a plan view of a metal plate 60 for forming the conventional shield cover 50.

The metal plate 60 has a shape which is bilaterally symmetrical about a central line CL extending back-and-forth. More specifically, the metal plate 60 comprises a substantially rectangular ceiling portion 51 with four corners which are chamfered, and four side wall portions 52, 53, 54, and 55 which are formed at four sides of the ceiling portion 51. The four side wall portions 52, 53, 54, and 55 are called front side wall portion, rear side wall portion, a right side wall portion, and a left side wall portion, respectively. The front side wall portion 52 consists of a pair of front side wall pieces which are apart from each other so that the central line CL forms the boundary therebetween and between which an opening is left. In addition, between the pair of front side wall pieces, a holding piece 56 for holding a coaxial cable is formed. The metal plate 60 further comprises four corner portions 57 at the four corners.

By bending the front side wall portion 52, the rear side wall portion 53, the right side wall portion 54, the left side wall portion 55, the holding piece 56, and the four corner portions 57 at right angles to the ceiling portion 51 (at right angles towards a rear side with respect to a paper surface of FIG. 2), the shield cover 50 illustrated in FIG. 1A is formed.

The shield cover 50 having such as a structure is mounted on a back surface of a circuit board by soldering to the back surface of the circuit board at the corner portions 57.

However, in the conventional shield cover 50, there are gaps G at folded portions of the shielding cover 50 (i.e. between the four side wall portions 52 to 55 and the four corner portions 57), as shown in FIG. 1B. As a result, on mounting the shielding cover 50 on the back surface of the circuit board by soldering, solder is flowed in the inside of the shielding cover 50 through the gaps G and it results in danger of causing a short in an LNA circuit mounted in the inside of the shielding cover 50, as mentioned in the preamble of the instant specification.

Figure 3:
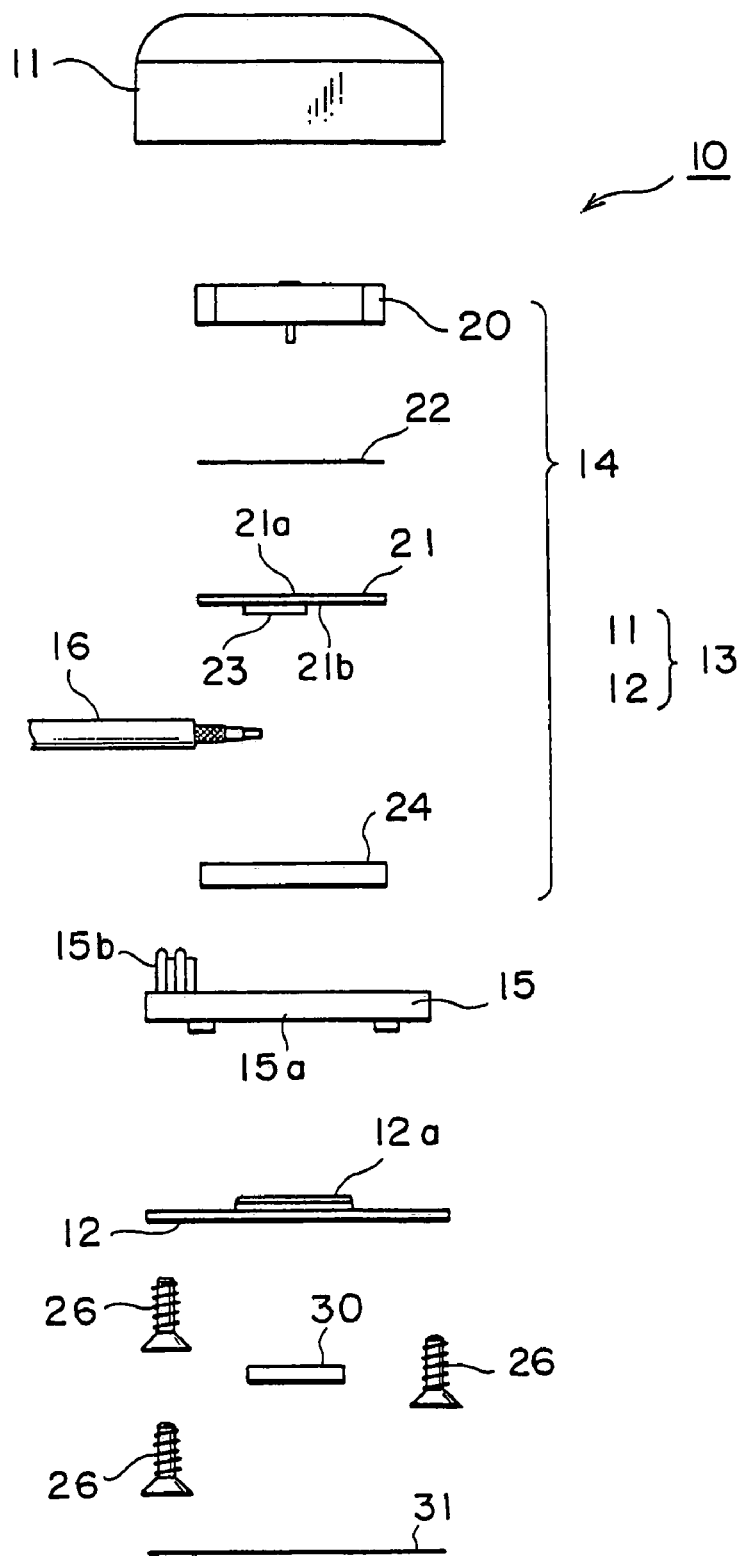
FIG. 3 is a schematic exploded view of an antenna unit according to an embodiment of this invention.

Referring to FIG. 3, the description will proceed to an antenna unit 10 according to an embodiment of this invention. The illustrated antenna unit 10 is an antenna unit for receiving GPS (Global Positioning System) signals.

The antenna unit 10 comprises an antenna case 13, an antenna module 14, a packing member 15, and a signal line (a coaxial cable) 16. The antenna case 13 comprises a domical top cover 11 and a bottom plate 12 which are connected to each other. The antenna module 14 is accommodated in the top cover 11. The packing member 15 is disposed in a connected portion between the top cover 11 and the bottom plate 12 in order to ensure adhesiveness of the antenna case 13. In addition, the packing member 15 is called a waterproofing packing because it serves a waterproofing function. The signal line 16 is connected to the antenna module 14.

The antenna module 14 comprises a planer antenna element 20 and a circuit board 21. The antenna unit 10 is an antenna for receiving the GPS signals transmitted from GPS satellites. In the example being illustrated, the planer antenna element 20 comprises a patch antenna. The circuit board 21 has a main surface (or an upper surface) 21a and a back surface (or a lower surface) 21b. On the main surface 21b of the circuit board 21, the planer antenna element 20 is mounted. On the back surface 21b of the circuit board 21, a signal processing circuit 23 is mounted. The signal processing circuit 23 is electrically connected to the planer antenna element 20. In the example being illustrated, the signal processing circuit 23 comprises a low noise amplifier (LNA) circuit. The LNA circuit 23 is a circuit for providing signal amplification to the GPS signals received by the planer antenna element 20. The planer antenna element 20 and the main surface 21b of the circuit board 21 are joined to each other by means of a double-faced tape 22 or the like.

On the back surface 21b of the circuit board 21, the signal line (the coaxial cable) 16 for taking the GPS signals to outside of the antenna case 13 is connected. That is, the signal line (the coaxial cable) 16 has an end connected to the LNA circuit 23. In addition, on the back surface 21b of the circuit board 21, a shield cover 24 for shielding the above-mentioned LNA circuit 23 is mounted. The signal line 16 is derived to the outside through a notch portion (not shown) formed in the top cover 11.

In the antenna unit 10, the top cover 11 and the bottom plate 12 are jointed and integrated with each other by securing the bottom plate 12 to the top cover 11 by three screws 26 with the antenna module 14 and the packing member 15 accommodated in an internal space of the top cover 11.

The packing member 15 is made of resin material, for example, ethylene-propylene-diene-methylene (EPDM) rubber or the like. The packing member 15 comprises a base portion 15a for covering the whole surface of the antenna module 14 and a gasket portion 15b for covering an outer periphery of the signal line 16 at a position of the notch portion formed in the top cover 11.

The bottom plate 12 has a single concave portion 12a formed in a central portion thereof. In the concave portion 12a, a permanent magnet 30 is disposed. The permanent magnet 30 is for magnetically attractively fixing the antenna unit 10 on the roof of the automobile. In addition, on a main surface of the bottom plate 12 at a side bordering the outside, a resin sheet 31 is pasted across a substantially whole surface of the main surface. The resin sheet 31 is for preventing the roof of the automobile from scratching. On the resin sheet 31, a model number, a name of the antenna unit 10 and so on are printed.

Figure 4A:
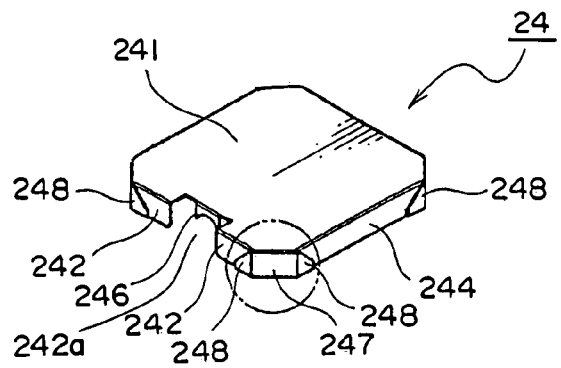
FIG. 4A is an external perspective view showing an overall appearance of a shield cover, which is illustrated in FIG. 3, according to a first embodiment of this invention.
Figure 4B:
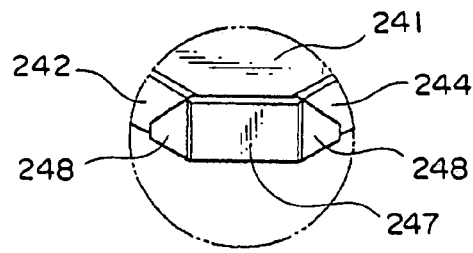
FIG. 4B is a fragmentary enlarged view of a portion enclosed by a circle of a two-dot-dash-line of FIG. 4A.
Figure 5:
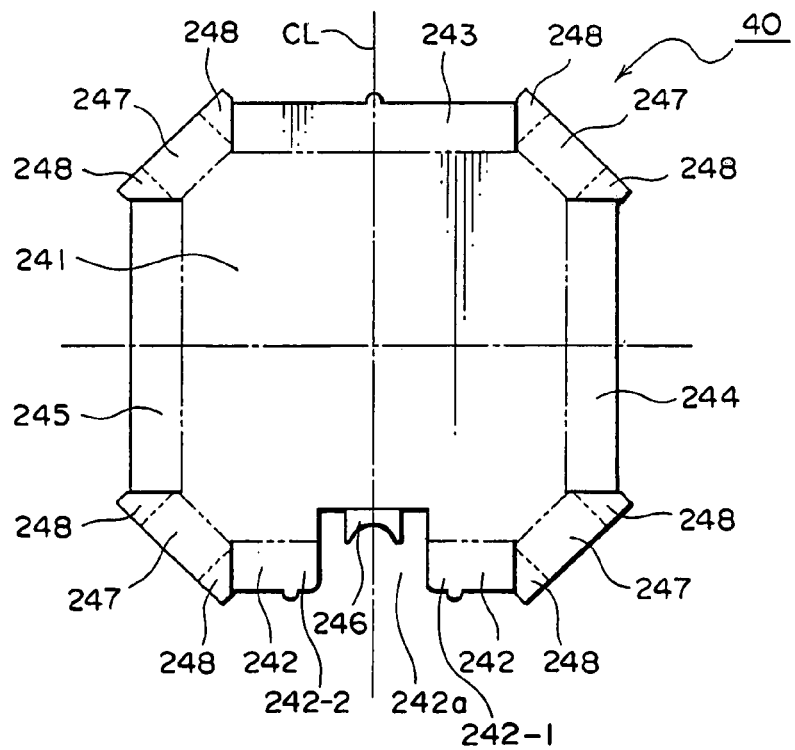
FIG. 5 is a plan view of a metal plate for forming the shield cover illustrated in FIG. 4A.

Referring to FIGS. 4A, 4B, and 5, the description will proceed to a shield cover 24, which is illustrated in FIG. 3, according to a first embodiment of this invention. FIG. 4A is an external perspective view showing an overall appearance of the shield cover 24. FIG. 4B is a fragmentary enlarged view of a portion enclosed by a circle of a two-dot-dash-line of FIG. 4A. FIG. 5 is a plan view of a metal plate 40 for forming the shield cover 24.

The metal plate 40 is similar in structure to the conventional metal plate 60 illustrated in FIG. 2 except that the corner portions have extension portions in the manner which will later be described.

The metal plate 40 has a shape which is bilaterally symmetrical about a central line CL extending back-and-forth. More specifically, the metal plate 40 comprises a substantially square ceiling portion 241 with four corners which are chamfered, and four side wall portions 242, 243, 244, and 245 which are formed at four sides of the ceiling portion 241. The four side wall portions 242, 243, 244, and 245 are called a front side wall portion, a rear side wall portion, a right side wall portion, and a left side wall portion, respectively. The front side wall portion 242 consists of a pair of front side wall pieces 242-1 and 242-2 which are apart from each other so that the central line CL forms the boundary therebetween and between which an opening 242a is left. In addition, between the pair of front side wall pieces 242-1 and 242-2, a holding piece 246 for holding the coaxial cable (the signal line) 16 is formed.

The metal plate 40 further comprises four corner portions 247 at the four corners. Each corner portion 247 comprises, at both ends, a pair of extension portions 248 overlapped with adjacent side wall portions.

By bending the front side wall portion 242, the rear side wall portion 243, the right side wall portion 244, the left side wall portion 245, the holding piece 246, and the four corner portions 247 at right angles to the ceiling portion 241 along a two-dot-dash-line (at right angles towards a rear side with respect to a paper surface of FIG. 5) and by bending the extension portions 248 at right angles to the respective adjacent side wall portions along a dot-dash-line, the shield cover 24 illustrated in FIG. 4A is formed.

Figure 6:
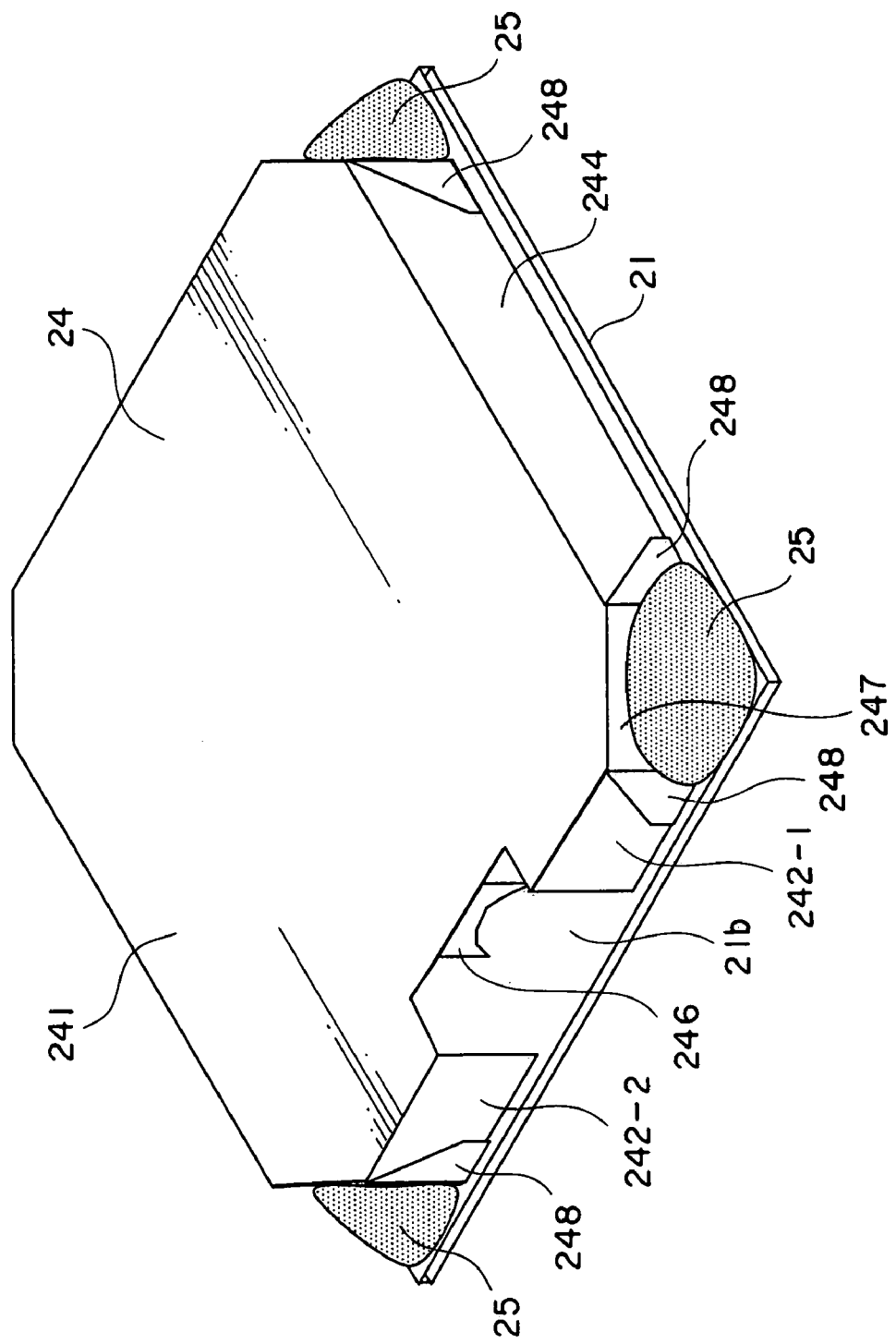
FIG. 6 is a perspective view of the shield cover illustrated in FIG. 4B that is mounted on a back surface of a circuit board.

The shield cover 24 having such as a structure is mounted on the back surface 21b of the circuit board 21 by soldering to the back surface 21b of the circuit board 21 at the four corner portions 247 by means of solder 25, as shown in FIG. 6.

Inasmuch as the shield cover 24 is soldered on the back surface 21b of the circuit board 21 at the four corners thereof, it is possible to make length and width dimensions of the shield cover 24 larger up to the substantially same level of length and width dimensions of the circuit board 21.

There is no gap in folded portions of the shield cover 24. In other words, there are no gap between the four side wall portions 242 to 245 and the four corner portions 247. It is therefore possible to prevent solder from being flowed in the inside of the shield cover 24 on mounting the shield cover 24 on the back surface 21b of the circuit board 21 by soldering. As a result, there is no danger of causing a short in the LNA circuit 23 (FIG. 3) mounted in the inside of the shield cover 24.

Figure 7A:
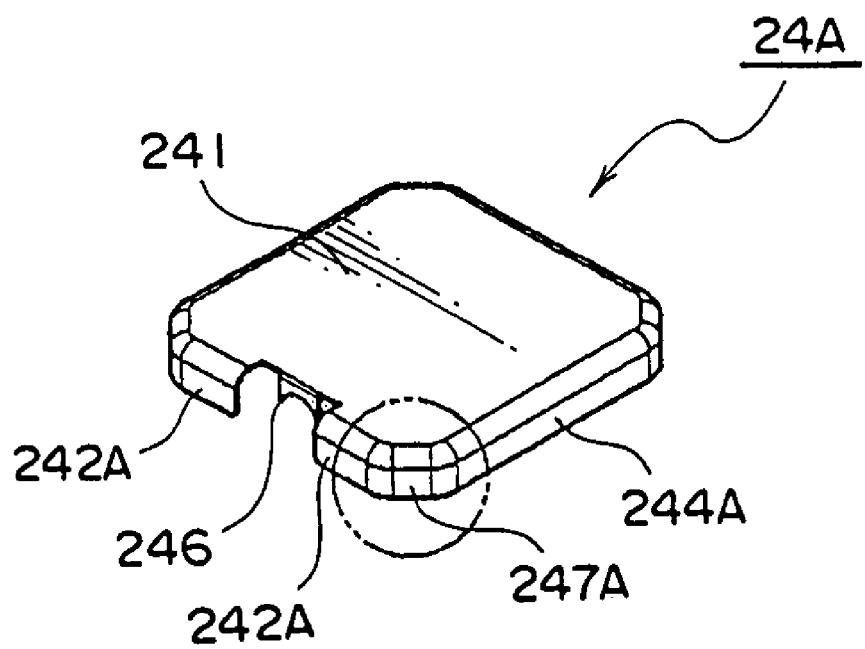
FIG. 7A is an external perspective view showing an overall appearance of a shield cover according to a second embodiment of this invention.
Figure 7B:
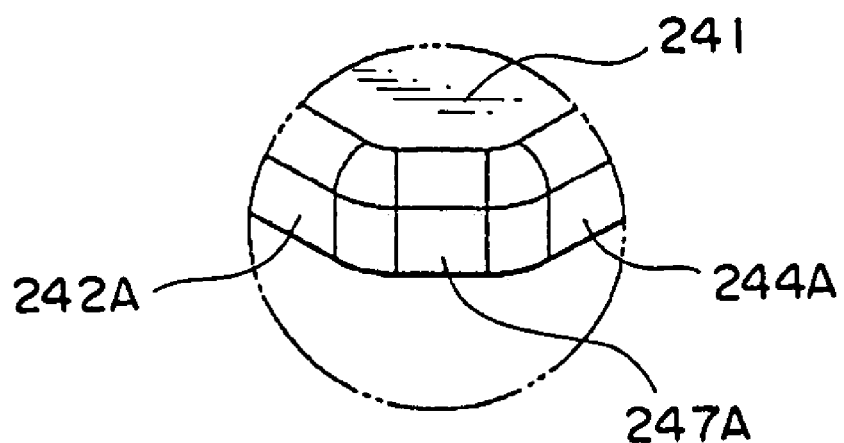
FIG. 7B is a fragmentary enlarged view of a portion enclosed by a circle of a two-dot-dash-line of FIG. 6A.

Referring to FIGS. 7A and 7B, the description will proceed to a shield cover 24A according to a second embodiment of this invention. FIG. 7A is an external perspective view showing an overall appearance of the shield cover 24A. FIG. 7B is a fragmentary enlarged view of a portion enclosed by a circle of a two-dot-dash-line of FIG. 7A.

Although the shield cover 24 illustrated in FIG. 4A has the shape with no gap between the four side wall portions and the four corner portions by bending working of the metal plate 40, the shield cover 24A has a shape with no gap between the four side wall portions and the four corner portions by drawing working of a metal plate using a press machine. That is, for example, as shown in FIG. 7B, a front side wall portion 242A, a corner portion 247A, and a right side wall portion 244A are continuously linked with no gap therebetween.

In addition, although illustration may not made clearly in FIG. 7A, the right side wall portion 244A, a corner portion, and a rear side wall portion are continuously linked with no gap therebetween, the rear side wall portion, a corner portion, and left side wall portion are continuously linked with no gap therebetween, and the left side wall portion, a corner portion, and the front side wall portion 242A are continuously linked with no gap therebetween.

Figure 8:
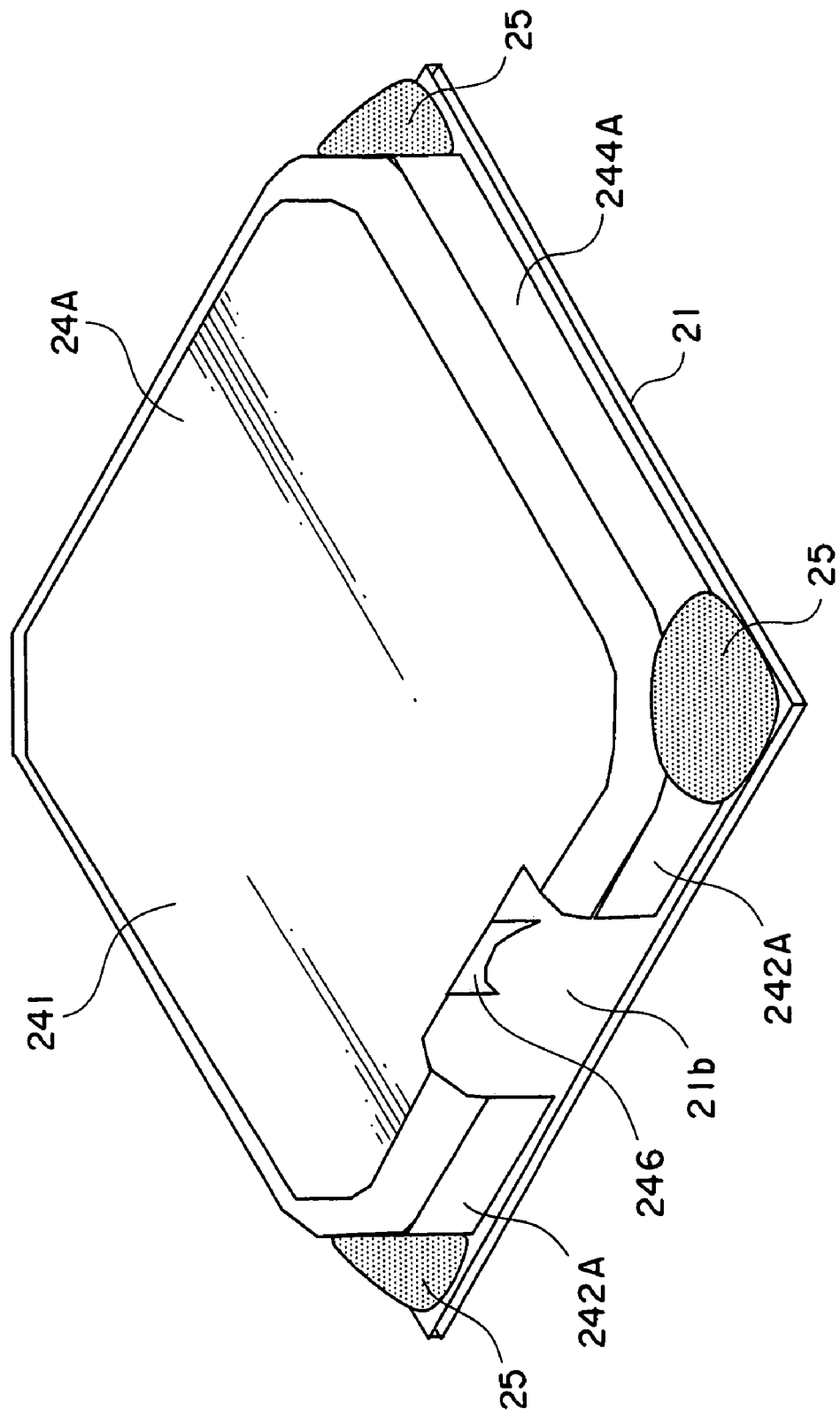
FIG. 8 is a perspective view of the shield cover illustrated in FIG. 7A that is mounted on a back surface of a circuit board.

The shield cover 24A having such as a structure is mounted on the back surface 21b of the circuit board 21 by soldering to the back surface 21b of the circuit board 21 at the four corner portions 247A by means of solder 25, as shown in FIG. 8.

With the shield 24A having such a structure also, it is possible to prevent solder 25 from being flowed in the inside of the shield cover 24A on mounting the shield cover 24A on the back surface 21b of the circuit board 21 by soldering. As a result, there is no danger of causing a short in the LNA circuit 23 (FIG. 3) mounted in the inside of the shield cover 24A.

While this invention has thus far been described in conjunction with the few preferred embodiments thereof, it will now be readily possible for those skilled in the art to put this invention into various other manners. For example, although the antenna unit described in the foregoing embodiment is suitable for the antenna unit for use in the GPS (Global Positioning System), the antenna unit according to this invention may not be restricted to this and may be applicable to an antenna unit for use in an SDARS (Satellite Digital Audio Radio Service) or antenna units for use in mobile communications for receiving other satellite waves and other terrestrial waves, and so on.

What is claimed is:

1. An antenna unit comprising:
   a circuit board having a main surface and a back surface which are opposed to each other;
   a planer antenna element mounted on the main surface of said circuit board;
   a signal processing circuit mounted on the back surface of said circuit board, said signal processing circuit being connected to said planer antenna element; and
   a shield cover, mounted on the back surface of said circuit board, for shielding said signal processing circuit,
   wherein said shield cover comprises:
   a substantially rectangular ceiling portion with four corners which are chamfered;
   four side wall portions for extending in a predetermined direction at four sides of said ceiling portion; and
   four corner portions for extending in the predetermined direction at the four corners of said ceiling portion between the side wall portions which are adjacent to each other;
   said shield cover being mounted on the back surface of said circuit board by soldering at the four corner portions, no gap being provided between said four side wall portions and said four corner portions.

2. The antenna unit as claimed in claim 1, wherein said shield cover is formed by bending working of a metal plate, said shield cover comprising extension portions overlapping with said side wall portions at both ends of said four corner portions.

3. The antenna unit as claimed in claim 2, wherein said metal plate has a shape which is bilaterally symmetrical about a central line extending back-and-forth.

4. The antenna unit as claimed in claim 3, said antenna unit further comprising a signal line connected to said signal processing circuit, wherein said four side wall portions comprise a front side wall portion, a rear side wall portion, a right side wall portion, and a left side wall portion, said front side wall portion consists of a pair of front side pieces which are apart from each so that the central line forms the boundary therebetween and between which an opening is left, said shield cover further comprising a holding piece, between the pair of front side wall pieces, for holding said signal line.

5. The antenna unit as claimed in claim 1, said shield cover is formed by drawing working of a metal plate using a press machine, said shield cover having a shape where said side wall portion and the corner portion which are adjacent to each other are continuously associated.

6. The antenna unit as claimed in claim 1, wherein said antenna unit comprises a Global Positioning System (GPS) antenna for receiving GPS signals transmitted from GPS satellites.

7. The antenna unit as claimed in claim 1, wherein said planer antenna element comprises a patch antenna.

8. The antenna unit as claimed in claim 1, wherein said signal processing circuit comprises a low noise amplifier (LNA) circuit for amplifying a signal received by said planer antenna element.

9. A shield cover for shielding a circuit mounted on one surface of a circuit board, said shield cover comprising:
   a substantially rectangular ceiling portion with four corners which are chamfered;
   four side wall portions for extending in a predetermined direction at four sides of said ceiling portion; and
   four corner portions for extending in the predetermined direction at the four corners of said ceiling portion between the side wall portions which are adjacent to each other;
   said shield cover being mounted on the one surface of said circuit board by soldering at the four corner portions, no gap being provided between said four side wall portions and said four corner portions.

10. The shield cover as claimed in claim 9, wherein said shield cover is formed by bending working of a metal plate, said shield cover comprising extension portions overlapping with said side wall portions at both ends of said four corner portions.

11. The shield cover as claimed in claim 10, wherein said metal plate has a shape which is bilaterally symmetrical about a central line extending back-and-forth.

12. The shield cover as claimed in claim 11, wherein said four side wall portions comprise a front side wall portion, a rear side wall portion, a right side wall portion, and a left side wall portion, said front side wall portion consisting of a pair of front side pieces which are apart from each so that the central line forms the boundary therebetween and between which an opening is left, said shield cover further comprising a holding piece, between the pair of front side wall pieces, for holding a signal line connected to said circuit.

13. The shield cover as claimed in claim 9, said shield cover is formed by drawing working of a metal plate using a press machine, said shield cover having a shape where said side wall portion and the corner portion which are adjacent to each other are continuously associated.

* * * * *